United States Patent
Yamamoto

(10) Patent No.: US 9,953,987 B2
(45) Date of Patent: Apr. 24, 2018

(54) SEMICONDUCTOR DEVICE

(71) Applicant: Renesas Electronics Corporation, Tokyo (JP)

(72) Inventor: Yoshiki Yamamoto, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/667,505

(22) Filed: Aug. 2, 2017

(65) Prior Publication Data
US 2017/0330885 A1    Nov. 16, 2017

Related U.S. Application Data

(63) Continuation of application No. 15/264,450, filed on Sep. 13, 2016, now Pat. No. 9,754,661.

(30) Foreign Application Priority Data

Nov. 13, 2015    (JP) .................. 2015-222995

(51) Int. Cl.
*G11C 11/00* (2006.01)
*H01L 27/11* (2006.01)
(Continued)

(52) U.S. Cl.
CPC ........ *H01L 27/1104* (2013.01); *G11C 11/412* (2013.01); *G11C 11/419* (2013.01);
(Continued)

(58) Field of Classification Search
CPC .. G11C 16/0441; G11C 11/412; G11C 11/419
See application file for complete search history.

(56) References Cited

U.S. PATENT DOCUMENTS

| 9,287,292 B2 | 3/2016 | Tsuchiya et al. |
| 2007/0296020 A1* | 12/2007 | Shiba .............. G11C 16/0441 257/315 |
| 2012/0292679 A1 | 11/2012 | Funayama |

FOREIGN PATENT DOCUMENTS

JP    2009-135140 A    6/2009

OTHER PUBLICATIONS

U.S. Non-Final Office Action dated Jan. 19, 2017 in U.S. Appl. No. 15/264,450.
(Continued)

*Primary Examiner* — Thong Q Le
(74) *Attorney, Agent, or Firm* — McGinn IP Law Group, PLLC

(57) ABSTRACT

A semiconductor device, including: a semiconductor substrate having a first well region; an insulating layer formed on a first portion of the semiconductor substrate, and contacted with the first well region; a semiconductor layer formed on the insulating layer; an element isolation region reaching to an inside of the first well region, in a cross-sectional view; a first gate electrode layer formed on a first portion of the semiconductor layer via a first gate insulating film; a second gate electrode layer formed on both a second portion of the semiconductor layer via a second gate insulating film and a first portion of the element isolation region; an interlayer insulating film covering the first gate electrode layer, the second gate electrode layer and a second portion of the element isolation region; a first plug conductor layer formed in the interlayer insulating film.

20 Claims, 13 Drawing Sheets

(51) Int. Cl.
*H01L 27/12* (2006.01)
*G11C 11/412* (2006.01)
*G11C 11/419* (2006.01)
*H01L 23/528* (2006.01)
*H01L 29/06* (2006.01)

(52) U.S. Cl.
CPC ........ *H01L 23/528* (2013.01); *H01L 27/1116* (2013.01); *H01L 27/1203* (2013.01); *H01L 29/0649* (2013.01); *H01L 29/0692* (2013.01)

(56) References Cited

OTHER PUBLICATIONS

U.S. Notice of Allowance dated Apr. 27, 2017 in U.S. Appl. No. 15/264,450.

* cited by examiner

FIG. 2

| | n-TYPE WELL REGION NW POTENTIAL | PMOS THRESHOLD (ABSOLUTE VALUE) | P-TYPE WELL REGIONS PW1, PW2 POTENTIAL | NMOS THRESHOLD (ABSOLUTE VALUE) |
|---|---|---|---|---|
| STANDBY TIME | Vdd+2.0 | 0.5 | VSS-2.0 | 0.5 |
| READING/WRITING TIME | Vdd | 0.25 | VSS | 0.25 |

UNIT: V
Vdd = 0.5~1.2V, VSS = 0V

SEMICONDUCTOR DEVICE

CROSS-REFERENCE TO RELATED APPLICATIONS

The present application is a Continuation application of U.S. patent application Ser. No. 15/264,450, filed on Sep. 13, 2016, which is based on Japanese Patent Application No. 2015-222995 filed on Nov. 13, 2015 including the specification, drawings and abstract is incorporated herein by reference in its entirety.

BACKGROUND

The present invention relates to semiconductor devices and more particularly to technology useful for a semiconductor device having an SRAM disposed over an SOI substrate.

Japanese Unexamined Patent Application Publication No. 2009-135140 discloses a semiconductor device which includes PMOS and NMOS transistors with a thin-film BOX-SOI structure. The semiconductor device has a semiconductor support substrate, an insulating film with a thickness of 10 nm or less, and a semiconductor layer, in which a PMOS transistor and an NMOS transistor are formed in a surface of the semiconductor layer. A well region lies under the semiconductor layer through the insulating film with a thickness of 10 nm or less and thresholds for the PMOS and NMOS transistors are changed by applying a desired voltage to the well region.

SUMMARY

The present inventors have conducted researches into semiconductor devices which have SRAM memory cells including NMOS and PMOS transistors with a thin-film BOX-SOI structure. Each SRAM memory cell includes two PMOS load transistors, two NMOS driver transistors, and two access transistors. The two load transistors are formed in an n-type well region and the two driver transistors and two access transistors are formed in a p-type well region.

Such SRAM memory cells are arranged in the X and Y directions over a semiconductor substrate in a matrix pattern to configure a memory array and such memory cells are arranged in the X and Y directions in a matrix pattern.

The p-type well region and n-type well region extending in the Y direction lie continuously in a plurality of memory arrays, and a tap region with a desired width extending in the X direction lies between memory arrays adjacent to each other in the Y direction. The tap region is a region to supply power to the p-type well region and n-type well region, in which a power supply wiring to supply a first potential to the p-type well region and a power supply wiring to supply a second potential to the n-type well region extend in the X direction.

The SRAM memory cell includes a plurality of gate electrode layers (gate conductor film, gate conductor strip) which configure gate electrodes for the load transistors, driver transistors, and access transistors. In the tap region, no memory cells are disposed but a plurality of dummy gate electrode layers are disposed in the same layer as the gate electrode layers, and the dummy gate electrode layers are coupled with the power supply wirings. In other words, the first potential or second potential is supplied to the dummy gate strips.

However, it has been found from a research by the present inventors that a leak current occurs in an area of the tap region where a dummy gate electrode layer is located, thereby making it difficult to reduce power consumption of the semiconductor device.

Therefore, a technique to reduce power consumption of a semiconductor device having SRAM memory cells with a thin-film BOX-SOI structure is demanded.

The above and further objects and novel features of the invention will more fully appear from the following detailed description in this specification and the accompanying drawings.

According to an aspect of the present invention, there is provided a semiconductor device which includes: an n-type well region formed over the main surface of a semiconductor substrate; an element isolation region formed over the main surface of the semiconductor substrate; and a first active region and a second active region which are located in the n-type well region and surrounded by the element isolation region. The device further includes: an insulating film formed over the main surface of the semiconductor substrate in the first active region; a semiconductor layer formed over the insulating film; a gate electrode layer formed over the semiconductor layer through a gate insulating film; a p-type source region and a p-type drain region formed in the semiconductor layer at both ends of the gate electrode layer; and a dummy gate electrode layer formed over the semiconductor layer through the gate insulating film. The device further includes an n-type semiconductor region formed over a surface of the n-type well region in the second active region and a power supply wiring coupled with the n-type semiconductor region. The dummy gate electrode layer is electrically floating.

According to the present invention, power consumption of the semiconductor device can be reduced.

BRIEF DESCRIPTION OF THE DRAWINGS

FIG. 2 is a table showing the well region potentials and the thresholds for PMOS and NMOS transistors according to the embodiment;

DETAILED DESCRIPTION

Figure 1:
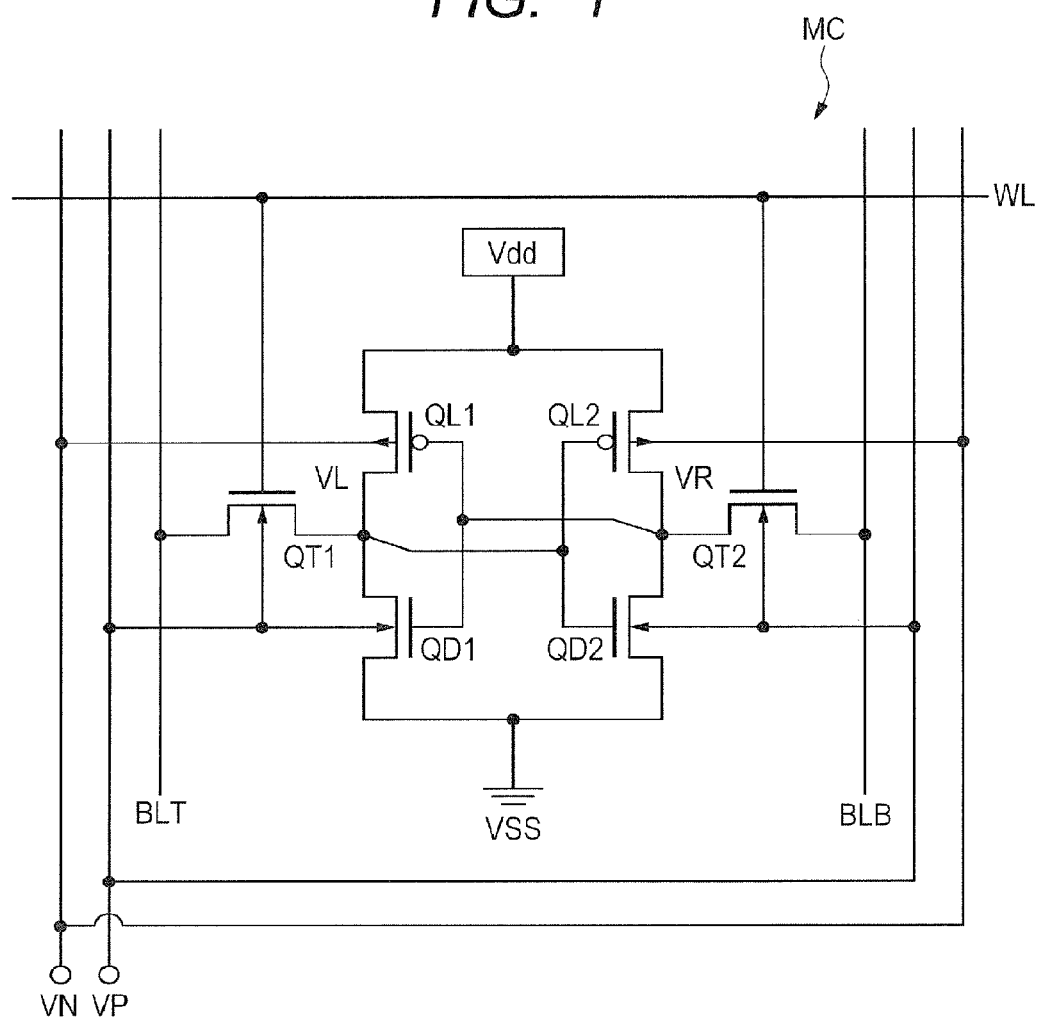
FIG. 1 is an equivalent circuit diagram showing a memory cell in an SRAM according to a preferred embodiment of the present invention.

The preferred embodiments of the present invention may be described below in different sections or separately as necessary or for the sake of convenience, but the embodiments described as such are not irrelevant to each other unless otherwise expressly stated. One embodiment may be, in whole or in part, a modified, detailed or supplementary form of another. In the preferred embodiments described below, when numerical information for an element (the number of pieces, numerical value, quantity, range, etc.) is given by a specific number, it is not limited to the specific number unless otherwise specified or theoretically limited to the specific number; it may be larger or smaller than the specific number. In the preferred embodiments described below, constituent elements (including constituent steps) are not necessarily essential unless otherwise specified or theoretically essential. Similarly, in the preferred embodiments described below, when a specific form or positional relation is indicated for an element, it should be interpreted to include a form or positional relation which is virtually equivalent or similar to the specific form or positional relation unless otherwise specified or theoretically limited to the specific form or positional relation. The same is true for the above numerical values and ranges.

Next, a preferred embodiment of the invention will be described in detail referring to the accompanying drawings. In all the drawings that illustrate the embodiment, members with like functions are designated by like reference numerals and repeated descriptions thereof are omitted. As for the embodiment described below, basically the same or similar elements or matters will not be repeatedly described except when necessary.

In the drawings which illustrate the embodiment, for easy understanding, hatching may be omitted even in a sectional view and for easy understanding, hatching may be used even in a plan view.

First Embodiment

The semiconductor device according to this embodiment (semiconductor integrated circuit device, semiconductor storage device) has an SRAM region. The SRAM region includes a plurality of memory arrays (memory array regions) MA and tap regions TAP located between memory arrays MA. Each memory array MA includes a plurality of memory cells MC arranged in a matrix pattern.

Memory Cell Circuit Configuration

First, the circuit configuration of a memory cell MC in the SRAM of the semiconductor device according to this embodiment (semiconductor integrated circuit device, semiconductor storage device) will be described. FIG. 1 is an equivalent circuit diagram showing a memory cell MC in the SRAM according to the embodiment. The memory cell MC is located at the intersection between a pair of bit lines (bit line BLT, bit line BLB) and a word line WL. The memory cell MC includes a pair of load transistors (load MOS, MOS for load, transistor for load, MISFET for load) QL1 and QL2, a pair of access transistors (access MOS, transistor for access, MISFET for access, transistor for transfer) QT1 and QT2, and a pair of driver transistors (driver MOS, transistor for driving, MISFET for driving) QD1 and QD2.

Among the six transistors which configure the memory cell MC, the load transistors QL1 and QL2 are p-type (p channel type) transistors and the access transistors QT1 and QT2 and driver transistors QD1 and QD2 are n-type (n channel type) transistors.

MISFET is an abbreviation for Metal Insulator Semiconductor Field Effect Transistor and sometimes called MOS. For example, the load transistors QL1 and QL2 are called PMOS (PMIS) and the access transistors QT1 and QT2 and driver transistors QD1 and QD2 are called NMOS (NMIS). Also, in the explanation below, the load transistors, access transistors, and driver transistors may be simply called "transistors". Also, each transistor may be expressed simply by its reference sign (QL1, QL2, QT1, QT2, QD1, QD2).

Among the six transistors of the memory cell MC, QL1 and QD1 configure a CMOS inverter and QL2 and QD2 configure another CMOS inverter. The input/output terminals of this pair of CMOS inverters (storage nodes VL and VR) are cross-linked to configure a flip-flop circuit as a data storage to store one bit of data.

Next, how the six transistors of the SRAM memory cell MC are coupled with each other will be described in detail.

QL1 is coupled between the supply potential line (first potential) Vdd and the storage node VL, and QD1 is coupled between the storage node VL and the grounding potential line (GND, 0 V, reference potential, second potential lower than the first potential) VSS, thereby configuring a CMOS inverter and the gate electrodes of QL1 and QD1 are coupled with the storage node VR.

QL2 is coupled between the supply potential line Vdd and the storage node VR, and QD2 is coupled between the storage node VR and the grounding potential line VSS, thereby configuring another CMOS inverter and the gate electrodes of QL2 and QD2 are coupled with the storage node VL.

QT1 is coupled between the bit line BLT and the storage node VL, and QT2 is coupled between the bit line BLB and the storage node VR, and the gate electrodes of QT1 and QT2 are coupled with the word line WL.

In this embodiment, the six transistors have a thin-film BOX-SOI structure and are formed over a semiconductor layer SM which is an SOI layer of an SOI substrate, which will be described later (see FIGS. 6 and 7).

Furthermore, QL1 and QL2 have a back gate located through an insulating layer BOX under the semiconductor layer SM. The back gate of QL1 and QL2 is an n-type well region (semiconductor region, back gate region) NW. QT1 and QD1 have a back gate located through the insulating layer BOX under the semiconductor layer SM. The back gate of QT1 and QD1 is a p-type well region (semiconductor region, back gate region) PW1. QT2 and QD2 have a back gate located through the insulating layer BOX under the semiconductor layer SM. The back gate of QT2 and QD2 is a p-type well region (semiconductor region, back gate region) PW2. The n-type well region NW is coupled with a power supply wiring VN and the p-type well regions PW1 and PW2 are coupled with a power supply wiring VP. The PMOS and NMOS which configure a memory cell MC have a structure called FD-SOI (Fully-Depleted Silicon on Insulator), in which the semiconductor layer SM which serves as a channel region is very thin. Furthermore, since the back gates are used to control the thresholds for PMOS and NMOS, the insulating film BOX is also very thin.

Memory Operation

Next, the memory operation of the memory cell MC of the SRAM will be described. When the storage node VL of one CMOS inverter is high in potential (H), QD2 is On and the storage node VR of the other CMOS inverter is low in potential (L). Therefore, QL1 is On and QD1 is Off, thereby keeping the high potential (H) of the storage node VL. In other words, the latch circuit in which a pair of CMOS inverters are cross-linked keeps the states of the storage nodes VL and VR so that data is held while power is applied. This is standby time (standby state).

On the other hand, the word line WL is coupled with the gate electrodes of QT1 and QT2. When the word line WL is high in potential (H), QT1 and QT2 are On and the flip-flop circuit and the bit lines (BLT, BLB) are electrically coupled, so the potential state of the storage nodes VL and VR (combination of H and L or combination of L and H) appears on the bit lines BLT and BLB and is read as data of the memory cell MC.

In order to write data in the memory cell, the word line WL is made high (H) and QT1 and QT2 are turned On to electrically couple the flip-flop circuit and the bit lines (BLT, BLB) to transmit the data of the bit lines BLT and BLB (combination of H and L or combination of L and H) to the storage nodes VL and VR and store the data as mentioned above.

FIG. 2 is a table showing the well region potentials and the thresholds for the PMOS and NMOS according to this embodiment. More specifically, the table shows the potentials (applied voltages) of the p-type well regions PW1 and PW2, the potentials (applied voltages) of the n-type well region NW, and the thresholds for the PMOS and NMOS during standby time and reading/writing time. In this embodiment, the through-currents of the one CMOS inverter and the other CMOS inverter are decreased by making the thresholds for the PMOS and NMOS of the memory cell MC during standby time higher than during reading/writing time.

This will be explained below, taking a case that the storage node VL of the one CMOS inverter is high in potential (H) and the storage node VR of the other CMOS inverter is low in potential (L), as an example.

As shown in FIG. 2, in reading or writing time, supply potential Vdd is applied from the power supply wiring VN to the n-type well region NW as the back gate of QL1 and QL2 (PMOS) and the threshold for QL1 and QL2 (PMOS) is set to, for example, 0.25 V (absolute value). Also, grounding potential VSS is applied from the power supply wiring VP to the n-type well regions NW1 and NW2 as the back gate of QD1 and QT1, and QD2 and QT2 and the threshold for QD1 and QT1, and QD2 and QT2 is set to, for example, 0.25 V (absolute value). The speed of reading and writing is increased by decreasing the thresholds for PMOS and NMOS.

On the other hand, in standby time, a voltage higher than supply voltage Vdd, (Vdd+2.0) V, is applied from the power supply wiring VN to the n-type well region NW as the back gate of QL1 and QL2 (PMOS) and the threshold for QL1 and QL2 (PMOS) is set to, for example, 0.5 V (absolute value). Also, a voltage lower than grounding potential VSS, (VSS-2.0) V, is applied from the power supply wiring VP to the p-type well regions PW1 and PW2 as the back gates of QD1 and QT1, and QD2 and QT2 and the threshold for QD1 and QT1, and QD2 and QT2 is set to, for example, 0.5 V (absolute value).

In other words, the leak current of QD1 and QD2 is decreased by increasing the threshold for QD1 and QL2 during standby time. For example, the leak current is prevented from flowing to QD1 and QL2 due to noise, etc. Thus, power consumption of the SRAM is reduced by decreasing the through-current of the one CMOS inverter and the other CMOS inverter.

Memory Cell Structure

Figure 3:
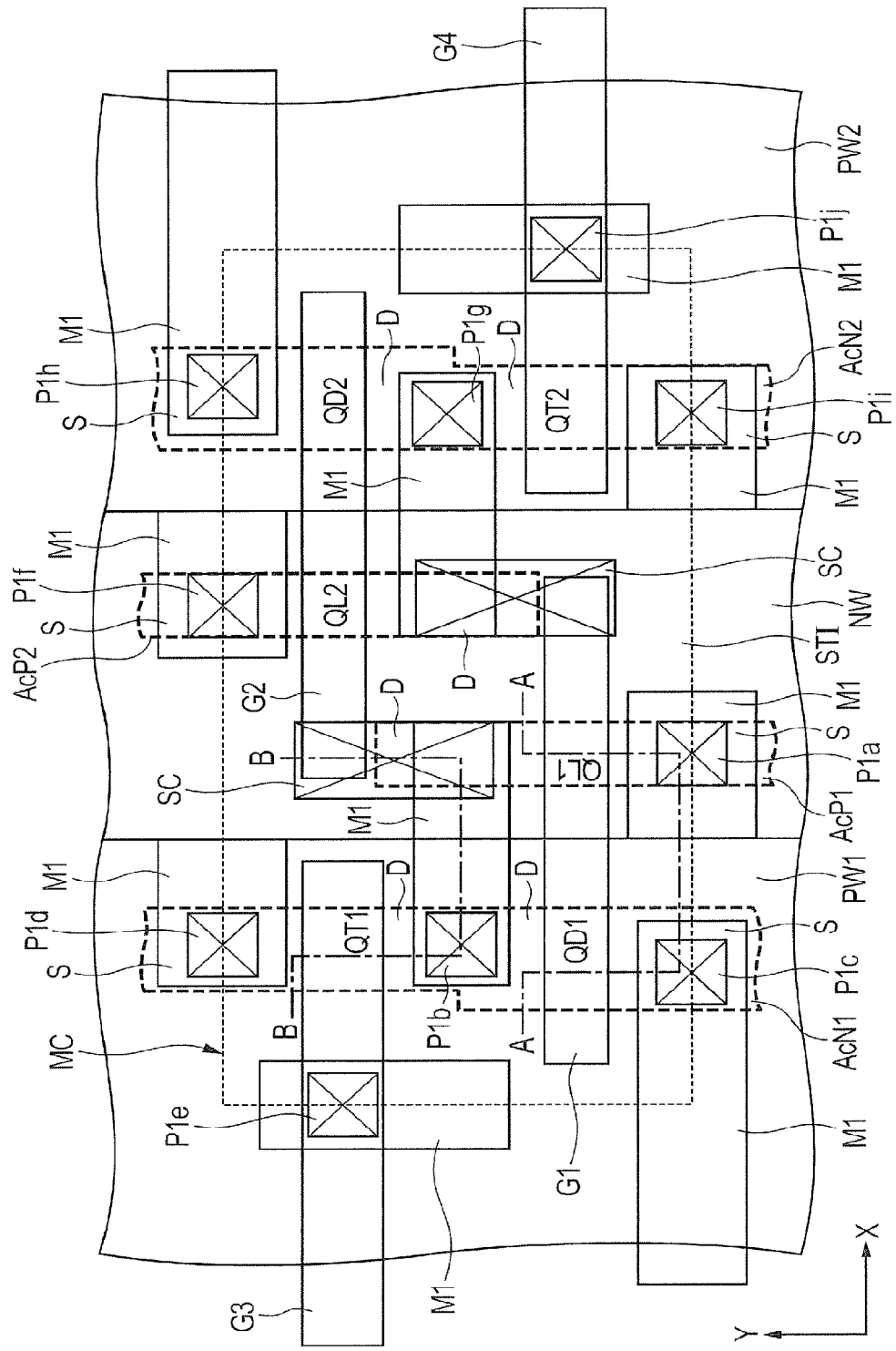
FIG. 3 is a plan view showing the structure of a memory cell of the SRAM according to the embodiment.
Figure 4:
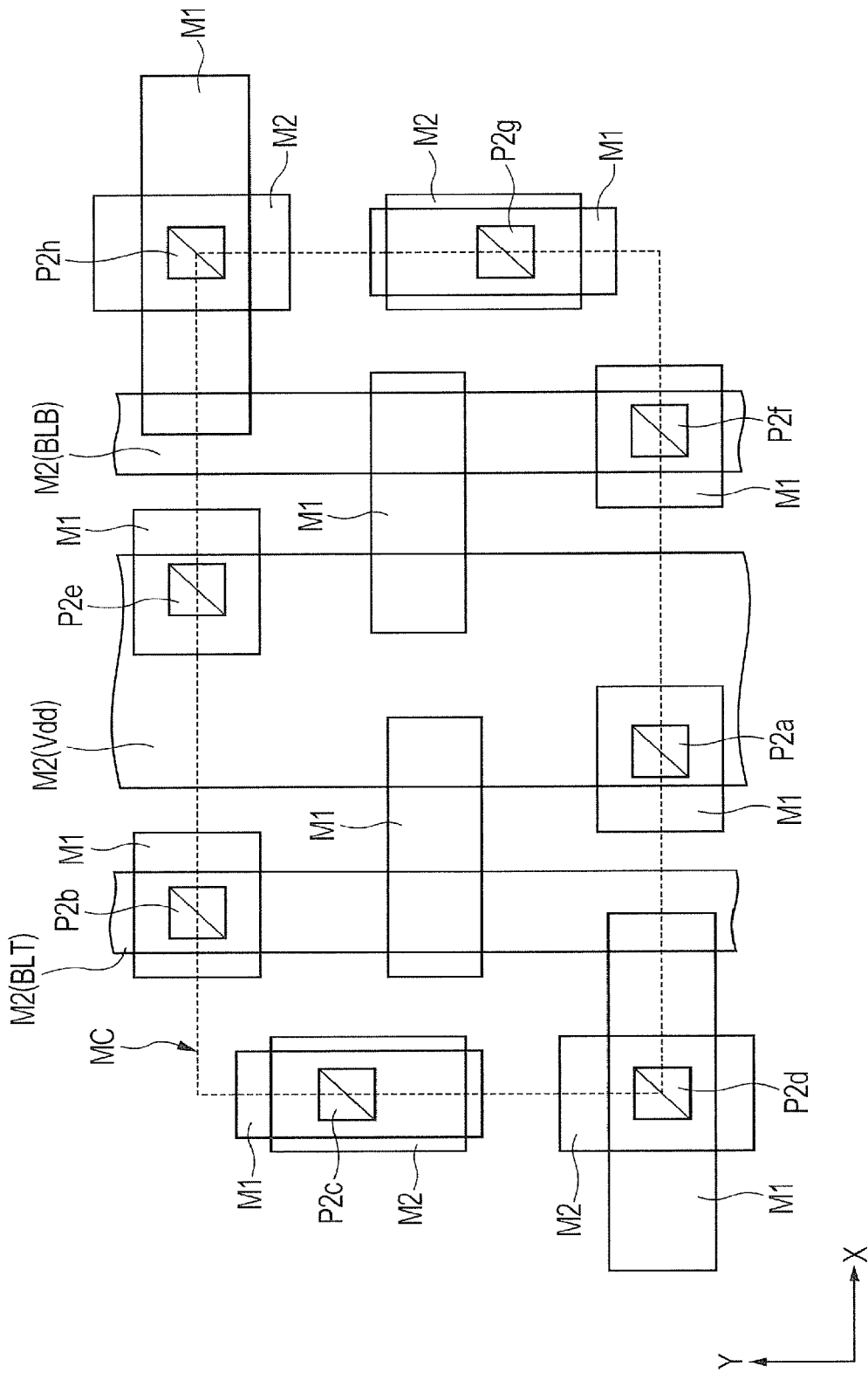
FIG. 4 is a plan view showing the structure of the memory cell of the SRAM according to the embodiment.
Figure 5:
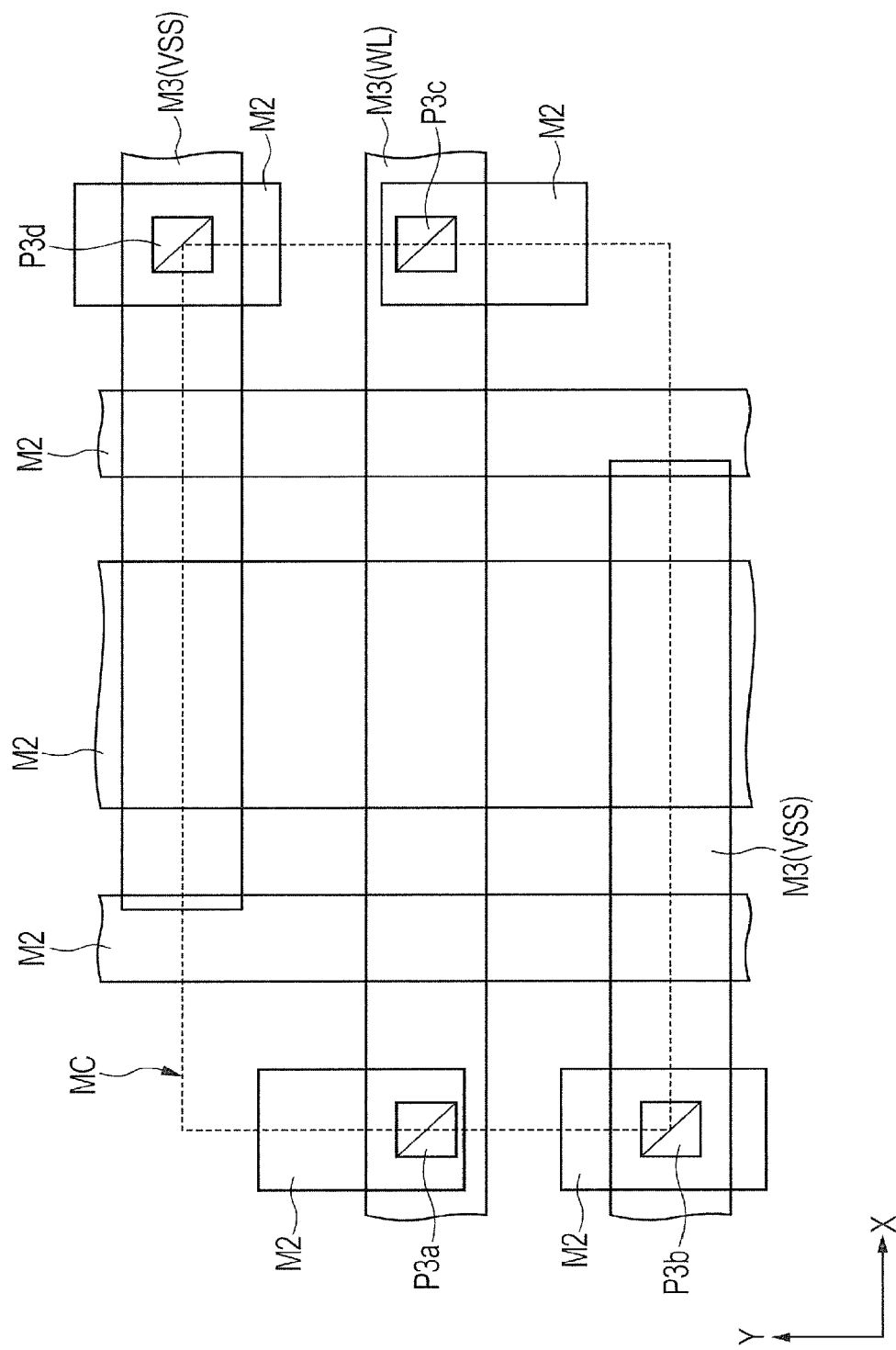
FIG. 5 is a plan view showing the structure of the memory cell of the SRAM according to the embodiment.

FIGS. 3 to 5 are plan views showing the structure of a memory cell MC of the SRAM according to this embodiment. FIG. 6 is a sectional view taken along the line A-A of FIG. 3 and FIG. 7 is a sectional view taken along the line B-B of FIG. 3.

The roughly rectangular region surrounded by the dotted line in FIG. 3 represents a memory cell MC for one bit. In FIG. 3, AcN1, AcP1, AcP2 and AcN2 represent active regions, G1, G2, G3, and G4 represent gate electrode layers, P1a, P1b, P1c, P1d, P1e, P1f, P1g, P1h, P1i, and P1j represent plug conductor layers, SC represents a shared contact conductor layer SC, and M1 represents a first layer wiring M1.

As shown in the figure, the four active regions AcN1, AcP1, AcP2, and AcN2 extending in the Y direction are arranged in the X direction in the order of mention. An element isolation region STI is disposed between (around) the active regions AcN1, AcP1, AcP2, and AcN2. In other words, the active regions AcN1, AcP1, AcP2, and AcN2 are marked off (defined) by the element isolation region STI.

The active regions AcP1 and AcP2 are rectangles which have the same width in the X direction, extend in the Y direction, and lie in the center of the memory cell MC adjacently to each other with a desired spacing between them. The active regions AcN1 and AcN2 are rectangles whose long sides extend in the Y direction and which are located in a manner to sandwich the active regions AcP1 and AcP2 in the X direction. The active region AcN1 has a width in the X direction of the area of QD1 which is larger than the width in the X direction of the area of QT1, taking the shape of two rectangles with different short side lengths joined together. The active region AcN2 has the same shape.

The four gate electrode layers G1 to G4 are located in a manner that two layers are arranged in line (linearly). The common gate electrode layer G1 crossing over the active regions AcN1 and AcP1 and the gate electrode layer G4 crossing over the active region AcN2 extend in the X direction and they lie over a virtual line extending in the X direction. The common gate electrode layer G3 crossing over the active regions AcP2 and AcN2 and the gate electrode layer G2 crossing over the active region AcN1 extend in the X direction and they lie over a virtual line extending in the X direction.

QD1 is formed at the intersection between the active region AcP1 and the gate electrode layer G1, QD1 is formed at the intersection between the active region AcN1 and the gate electrode layer G1, and QT1 is formed at the intersection between the active region AcN1 and the gate electrode layer G3. QL2 is formed at the intersection between the active region AcP2 and the gate electrode layer G2, QD2 is formed at the intersection between the active region AcN2 and the gate electrode layer G2, and QT2 is formed at the intersection between the active region AcN2 and the gate electrode layer G4.

Plug conductor layers P1a, P1b, P1c, P1d, P1e, P1f, P1g, P1h, P1i, and P1j or a shared contact conductor layer SC are located over the source/drain regions of the six transistors QD1, QT1, QL1, QL2, QT2, and QD2. The plug conductor layers P1a, P1b, P1c, P1d, P1e, P1f, P1g, P1h, P1i, and P1j or shared contact conductor layer SC are plugs (conductor layers) which couple the source/drain regions of the transistors QD1, QT1, QL1, QL2, QT2 and QD2 or the gate electrode layers G1 and G2, with the first wiring layer M1. The drain region of QL1 and the gate electrode layer G2 are coupled by the shared contact conductor layer SC and the drain region of QL2 and the gate electrode layer G1 are coupled by the shared contact conductor layer SC.

The plug conductor layer P1b coupled with the drain regions D of QD1 and QT1 and the shared contact conductor layer SC coupling the drain region D of QL1 and the gate electrode layer G2 are coupled by the first layer wiring M1. Similarly, the plug conductor layer P1g coupled with the drain regions D of QD2 and QT2 and the shared contact conductor layer SC coupling the drain region D of QL2 and the gate electrode layer G1 are coupled by the first layer wiring M1.

FIG. 4 shows plug conductor layers P2a, P2b, P2c, P2d, P2e, P2f, P2g, and P2h, and second layer wirings M2. The plug conductor layers P2a, P2b, P2c, P2d, P2e, P2f, P2g, and P2h are plugs which couple a first layer wiring M1 and a second layer wiring M2. The second layer wiring M2 configures the supply potential line Vdd and bit lines BLT and BLB, and the supply potential line Vdd and bit lines BLT and BLB extend in the Y direction. The supply potential line Vdd, located between the bit lines BLT and BLB, is wider than the bit lines BLT and BLB.

As known from FIGS. 3 and 4, the supply potential line Vdd is coupled with the source region S of QL1 through the plug conductor layer P2a, first layer wiring M1, and plug conductor layer P1a. Further, the supply potential line Vdd is coupled with the source region S of QL2 through the plug conductor layer P2e, first layer wiring M1, and plug conductor layer P1f.

The bit line BLT is coupled with the source region S of QT1 through the plug conductor layer P2b, first layer wiring M1, and plug conductor layer P1d. The bit line BLB is coupled with the source region S of QT2 through the plug conductor layer P2f, first layer wiring M1, and plug conductor layer P1i.

FIG. 5 shows the second layer wirings M2, plug conductor layers P3a, P3b, P3c, and P3d, and third layer wirings M3. The plug conductor layers P3a, P3b, P3c, and P3d are plugs which couple a second layer wiring M2 and a third layer wiring M3. The third layer wirings M3 configure the word line WL and grounding potential line VSS, and the word line WL and two grounding lines VSS extend in the X direction and are parallel to each other. In the Y direction, the word line WL lies between the two grounding potential lines VSS.

As shown in FIGS. 3 to 5, the word line WL is coupled with the gate electrode layer G3 through the plug conductor layer P3a, second layer wiring M2, plug conductor layer P2c, first layer wiring M1, and plug conductor layer P1e. Also, the word line WL is coupled with the gate electrode layer G4 through the plug conductor layer P3c, second layer wiring M2, plug conductor layer P2g, first layer wiring M1, and plug conductor layer P1j.

As seen in FIG. 5, the grounding potential line VSS located above the word line WL is coupled with the source region S of QD2 through the plug conductor layer P3d, second layer wiring M2, plug conductor layer P2h, first layer wiring M1, and plug conductor layer P1h. Also, as seen in FIG. 5, the grounding potential line VSS located below the word line WL is coupled with the source region S of QD1 through the plug conductor layer P3b, second layer wiring M2, plug conductor layer P2d, first layer wiring M1, and plug conductor layer P1c.

Figure 6:
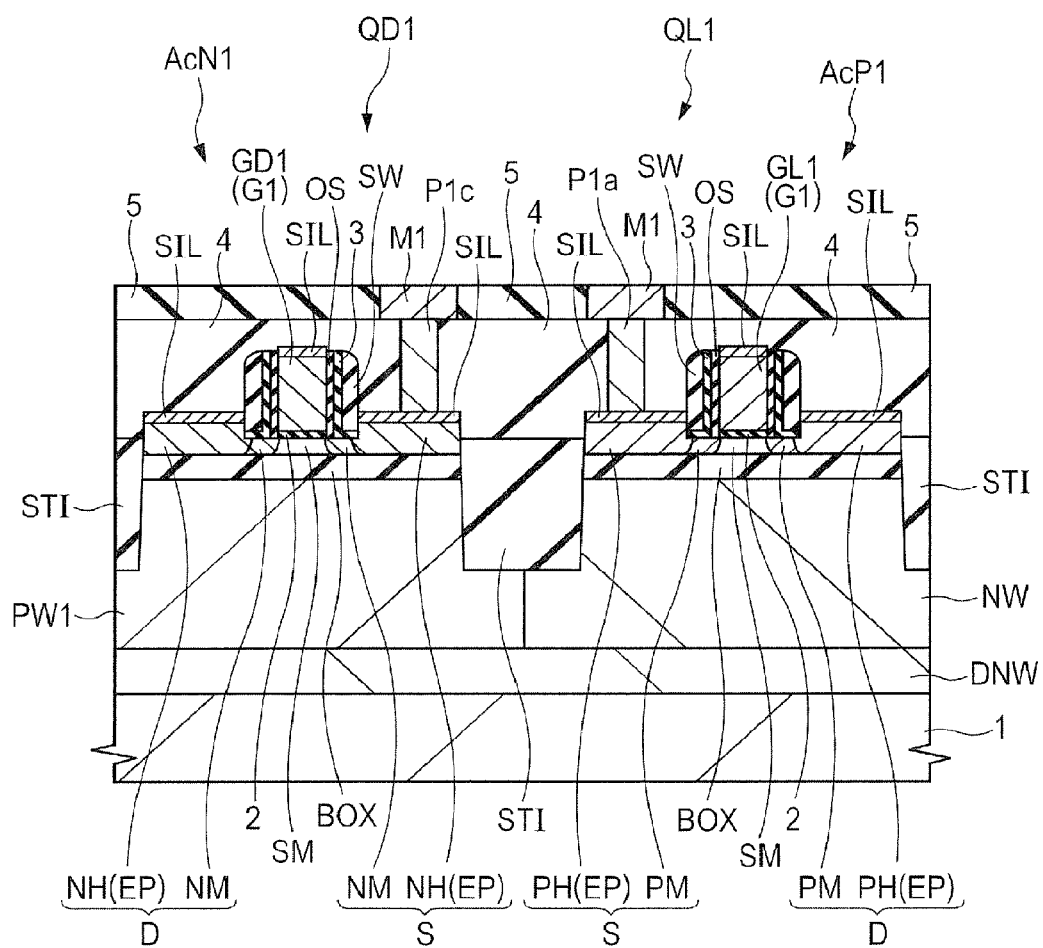
FIG. 6 is a sectional view taken along the line A-A of FIG. 3.
Figure 7:
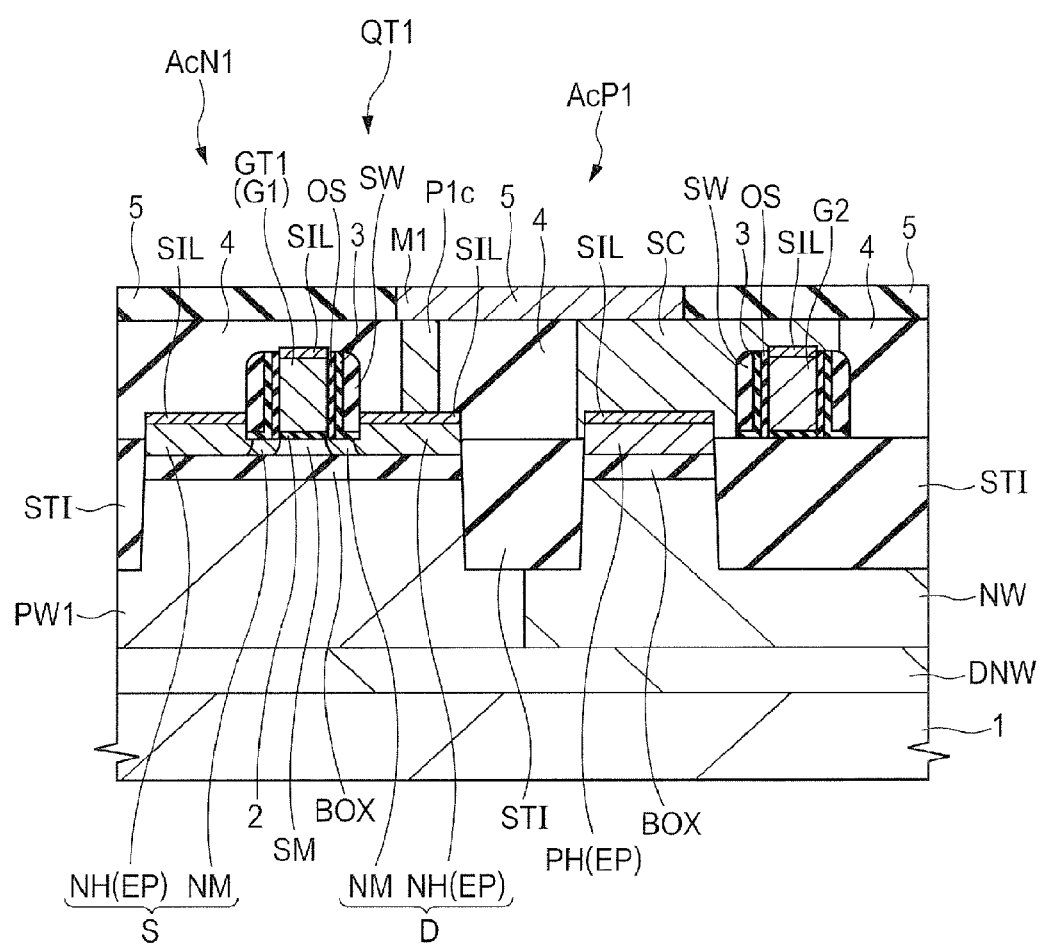
FIG. 7 is a sectional view taken along the line B-B of FIG. 3.

As shown in FIGS. 6 and 7, the memory cell MC of the SRAM according to this embodiment is formed over an SOI substrate.

The SOI substrate has a semiconductor substrate of silicon (support substrate, substrate) 1, an insulating layer BOX, and a semiconductor layer (element formation region) SM overlying the insulating layer BOX. The semiconductor layer (element formation region) SM is separated by an element isolation region STI. As mentioned earlier, the active regions AcP1 and AcN1 are marked off (separated) by the element isolation region STI. The insulating layer BOX is, for example, a silicon oxide film with a thickness of about 10 nm and isolates the semiconductor layer SM from the semiconductor substrate 1 or p-type well regions PW1, PW2 and n-type well region NW. The semiconductor layer SM is, for example, a silicon film with a thickness of about 10 to 15 nm. The element isolation region STI has an element isolation film as a silicon oxide film (SiO) or a laminated film including silicon nitride film (SiN) and silicon oxide film (SiO) or the like.

As shown in FIG. 6, the insulating layer BOX lies under the active region (semiconductor layer SM) AcN1 and the p-type well region PW1 lies under the insulating layer BOX. The insulating layer BOX lies under the active region (semiconductor layer SM) AcP1 and the n-type well region NW lies under the insulating layer BOX. An n-type buried well region DNW lies under the p-type well region PW1 and n-type well region NW and above the semiconductor substrate 1. The p-type well regions PW1 and PW2 and the n-type well region NW are formed in the main surface of the semiconductor substrate 1 and the semiconductor layer SM is formed over the main surface of the semiconductor substrate 1 through the insulating film BOX. The semiconductor layer SM or the main surface of the semiconductor substrate 1 which is surrounded by the element isolation region STI configures an active region.

FIG. 6 shows QD1 as an NMOS and QL1 as a PMOS. QD1 has the same structure as QT1, QD2, and QT2, and QL1 has the same structure as QL2. As shown in FIG. 6, an n-type gate electrode GD1 of QD1 is formed over the semiconductor layer SM in the active region AcN1 through a gate insulating film 2. The gate insulating film 2 is, for example, a 2 nm-thick silicon oxynitride film, but instead it may be a silicon oxide film or high-permittivity film called high-k film. The gate electrode GD1 is made of polycrystalline silicon film (polysilicon film) doped with n-type impurities. The gate insulating film 2 is very thin and thinner than the insulating film BOX or element isolation film.

The gate electrode QD1 has opposite sidewalls in the channel lengthwise direction of QD1 (horizontal direction in FIG. 6) and an offset spacer OS made of silicon nitride film is formed over the sidewalls, entirely covering the sidewalls of the gate electrode GD1. An insulating film 3 as a silicon oxide film and a sidewall insulating film SW as a silicon nitride film are formed over the offset spacer OS. The insulating film 3 and sidewall insulating film SW entirely cover the sidewalls of the gate electrode GD1 through the offset spacer OS.

In the channel lengthwise direction, an n-type low-concentration semiconductor region NM and an n-type high-concentration semiconductor region NH are formed on both sides of the gate electrode GD1 in a manner to sandwich the gate electrode GD1, and the n-type low-concentration semiconductor region NM and n-type high-concentration semiconductor region NH are a source region S or drain region D of QD1. The n-type impurity concentration of the n-type high-concentration semiconductor region NH is higher than the n-type impurity concentration of the n-type low-concentration semiconductor region NM, and the n-type high-concentration semiconductor region NH is remoter from the gate electrode GN1 than the n-type low-concentration semiconductor region NM. The n-type low-concentration semiconductor region NM and n-type high-concentration semiconductor region NH are in contact with the insulating layer BOX. The n-type high-concentration semiconductor region NH lies in a manner to straddle the semiconductor layer SM and an epitaxial layer EP made by selective growth of silicon over the semiconductor layer SM.

A silicide layer SIL is formed over the gate electrode GD1 and the front surface (upper surface) of the n-type high-concentration semiconductor region NH to decrease the resistance of the source region S, drain region D, and gate electrode GD1 of QD1. The source region S of QD1 is coupled with the first layer wiring M1 as conductor, through the plug conductor layer P1c as conductor. The plug conductor layer P1c is located in an interlayer insulating film 4 which covers QD1. The first layer wiring M1 is formed in a wiring trench in an insulating film 5.

As shown in FIG. 6, a p-type gate electrode GL1 of QL1 is formed over the semiconductor layer SM in the active region AcP1 through the gate insulating film 2. The gate insulating film 2 is, for example, a 2 nm-thick silicon oxynitride film, but instead it may be a silicon oxide film or high-permittivity film called high-k film. The gate electrode GL1 is made of polycrystalline silicon film (polysilicon film) doped with p-type impurities.

The gate electrode GL1 has opposite sidewalls in the channel lengthwise direction of QL1 (horizontal direction in FIG. 6) and an offset spacer OS made of silicon nitride film is formed over the sidewalls, entirely covering the sidewalls of the gate electrode GL1. An insulating film 3 as a silicon oxide film and a sidewall insulating film SW as a silicon nitride film are formed over the offset spacer OS. The insulating film 3 and sidewall insulating film SW entirely cover the sidewalls of the gate electrode GL1 through the offset spacer OS.

In the channel lengthwise direction, a p-type low-concentration semiconductor region PM and a p-type high-concentration semiconductor region PH are formed on both sides of the gate electrode GL1 in a manner to sandwich the gate electrode GL1 and the p-type low-concentration semiconductor region PM and p-type high-concentration semiconductor region PH are a source region S or drain region D of QL1. The p-type impurity concentration of the p-type high-concentration semiconductor region PH is higher than the p-type impurity concentration of the p-type low-concentration semiconductor region PM and the p-type high-concentration semiconductor region PH is remoter from the gate electrode GL1 than the p-type low-concentration semiconductor region PM. The p-type low-concentration semiconductor region PM and p-type high-concentration semiconductor region PH are in contact with the insulating layer BOX. The p-type high-concentration semiconductor region PH lies in a manner to straddle the semiconductor layer SM and an epitaxial layer EP made by selective growth of silicon over the semiconductor layer SM.

A silicide layer SIL is formed over the gate electrode GL1 and the front surface (upper surface) of the p-type high-concentration semiconductor region PH to decrease the resistance of the source region S, drain region D, and gate electrode GL1 of QL1. The source region S of QL1 is coupled with the first layer wiring M1 as conductor, through the plug conductor layer P1a as conductor. The plug conductor layer P1a is located in an interlayer insulating film 4 which covers QL1. The first layer wiring M1 is formed in a wiring trench in an insulating film 5. As can be understood from FIGS. 3 and 4, the first layer wiring M1 is coupled with the supply potential line Vdd as the second layer wiring M2.

Here, the silicide layer SIL includes, for example, a cobalt silicide (CoSi) layer, a titanium silicide (TiSi) layer, a nickel silicide (NiSi) layer, and a platinum (Pt)-containing nickel silicide (NiSi) layer.

The plug conductor layers P1c and P1a have a laminated structure which includes a barrier conductor film such as tungsten nitride (TiW) film or titanium nitride (TiN) film and a tungsten (W) main conductor film. The other plug conductor layers P1b, P1d, P1e, P1f, P1g, P1h, P1i, and P1j and shared contact conductor layer SC have the same structure as the plug conductor layers P1c and P1a.

The first layer wiring M1 is a copper wiring with a laminated structure which includes a barrier conductor film and a copper-based main conductor film overlying it. The barrier conductor film is made of tantalum (Ta), titanium (Ti), ruthenium (Ru), tungsten (W), manganese (Mn) or nitride or silicon nitride containing any of these elements or is a laminated film as a combination of these. The copper-based main conductor film is made of copper (Cu) or copper alloy (copper (Cu) combined with aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), indium (In), lanthanoid metal or actinoid metal).

The interlayer insulating film 4 is a silicon oxide film (SiO) and the insulating film 5 is a silicon oxide film (SiO); however, instead, they may be a carbon-containing silicon oxide film (SiOC film), silicon oxide film containing nitrogen and carbon (SiCON film) film or fluorine-containing silicon oxide film (SiOF film), in the form of a single-layer film or laminated film.

Next, as shown in FIG. 7, QT1 is formed over the semiconductor layer SM in the active region AcN1 and QT1 includes a gate electrode GT1. QT1 is structurally the same as QD1 which has been mentioned above and its description is omitted.

As shown in FIG. 7, the active region AcP1 lies adjacent to the active region AcN1 through the element isolation region STI and a p-type high-concentration semiconductor region PH and a silicide layer SIL are formed over the surface of the active region AcP1. As can be known from FIG. 3, the p-type high-concentration semiconductor region PH is a drain region D of QL1. Also, a gate electrode layer G2 lies over the element isolation region STI adjacent to the active region AcP1. As shown in FIGS. 3 and 7, the shared contact conductor layer SC extends continuously (integrally) from the active region AcP1 where the drain region D of QL1 lies, lying over the gate electrode layer G2. In short, the drain region D of QL1 and the gate electrode layer G2 are coupled by the shared contact conductor layer SC.

As shown in FIG. 7, the drain region D of QT1 is coupled with the shared contact conductor layer SC through the plug conductor layer P1c and first layer wiring M1. In other words, as shown in FIGS. 3 and 7, the drain region D of QT1, the drain region D of QL1, and the gate electrode layer G2 where QL2 and QD2 are formed are electrically coupled through the plug conductor layer P1b, first layer wiring M1 and shared contact conductor layer SC.

Tap Region

Figure 8:
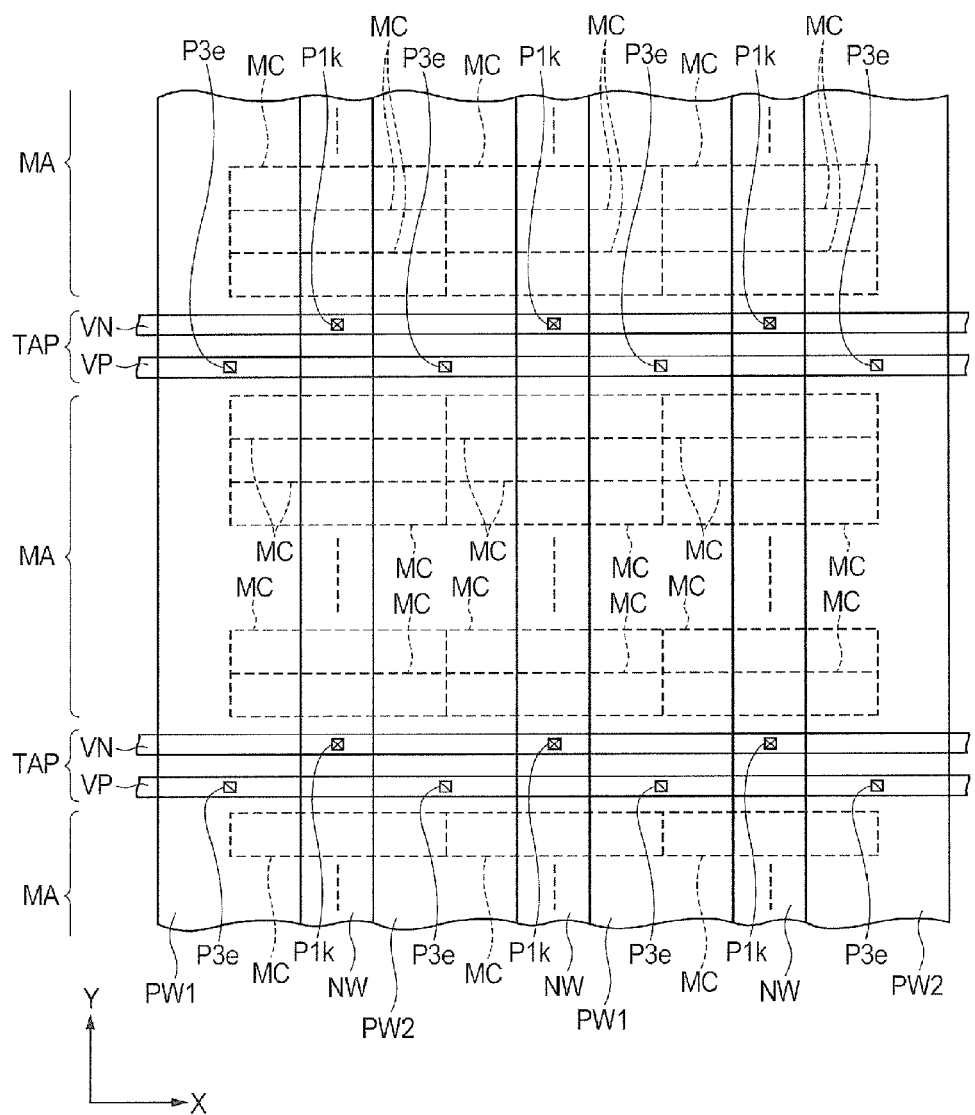
FIG. 8 is a plan view conceptually showing the position of a tap region in the SRAM region according to the embodiment.
Figure 9:
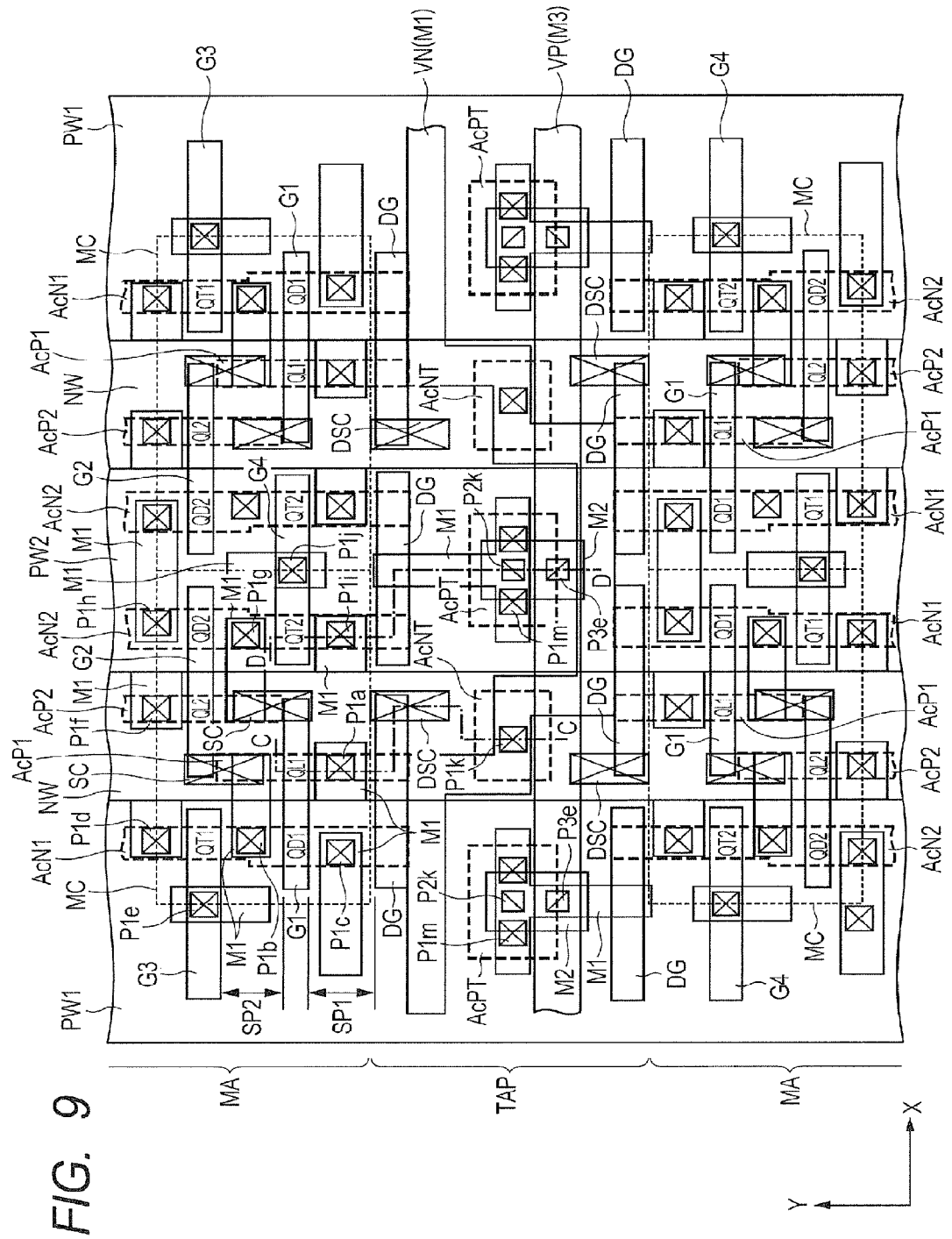
FIG. 9 is a plan view showing memory arrays and a tap region in the SRAM region according to the embodiment.
Figure 10:
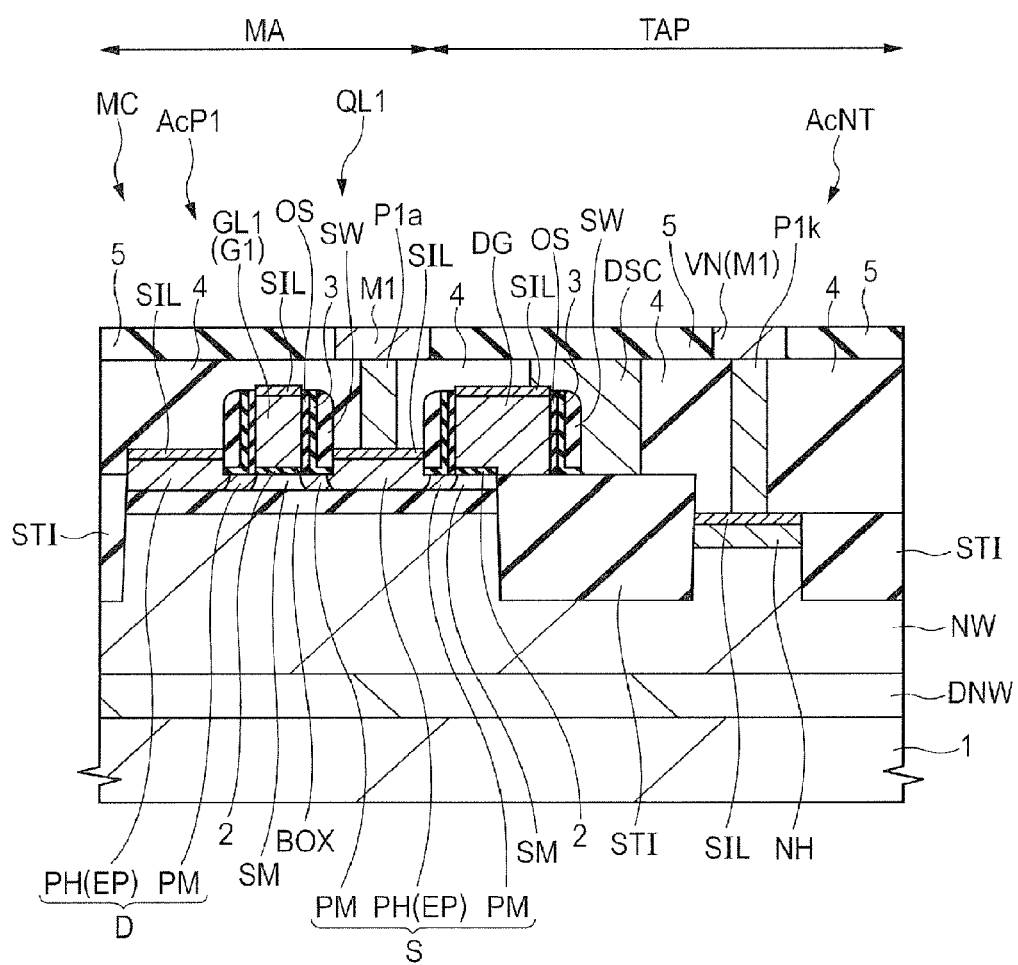
FIG. 10 is a sectional view taken along the line C-C of FIG. 9.
Figure 11:
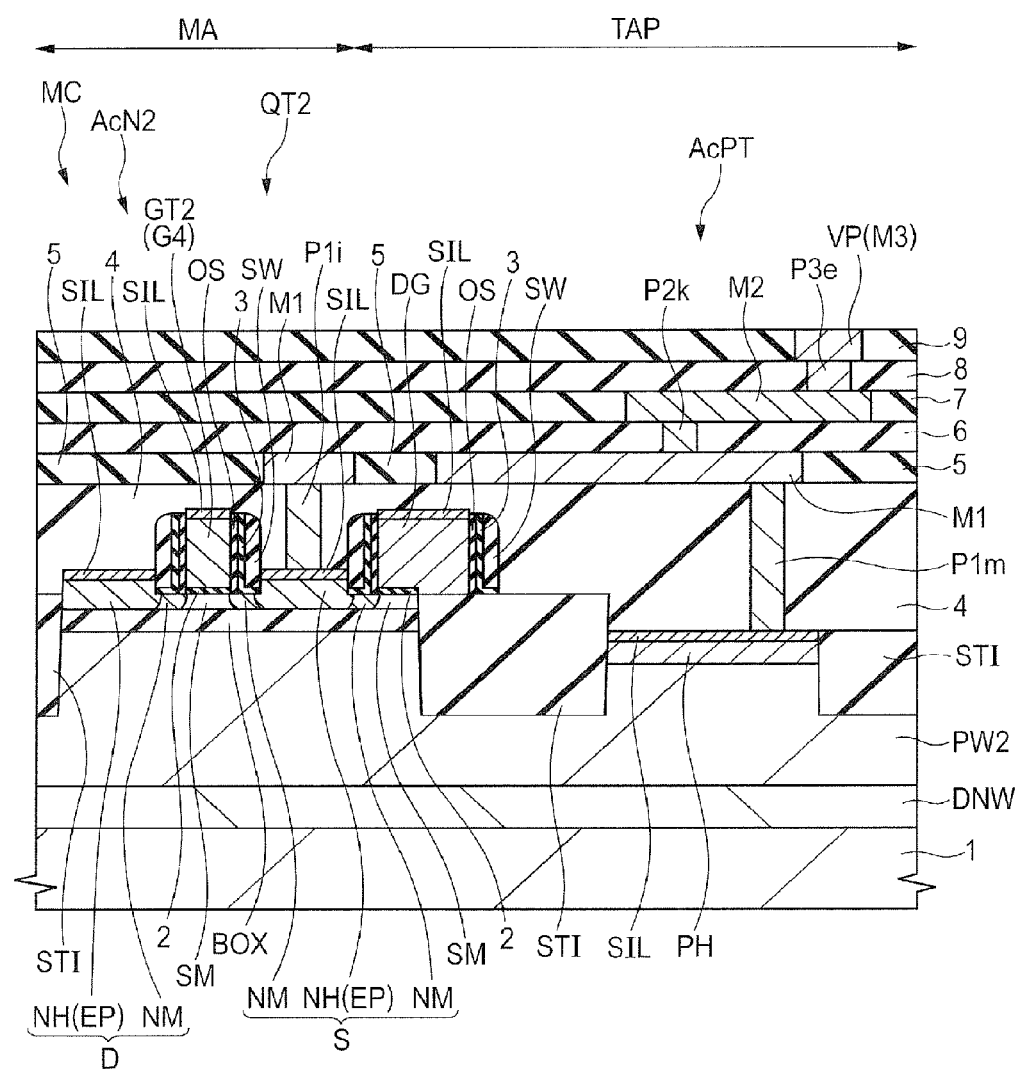
FIG. 11 is a sectional view taken along the line D-D of FIG. 9.
Figure 12:
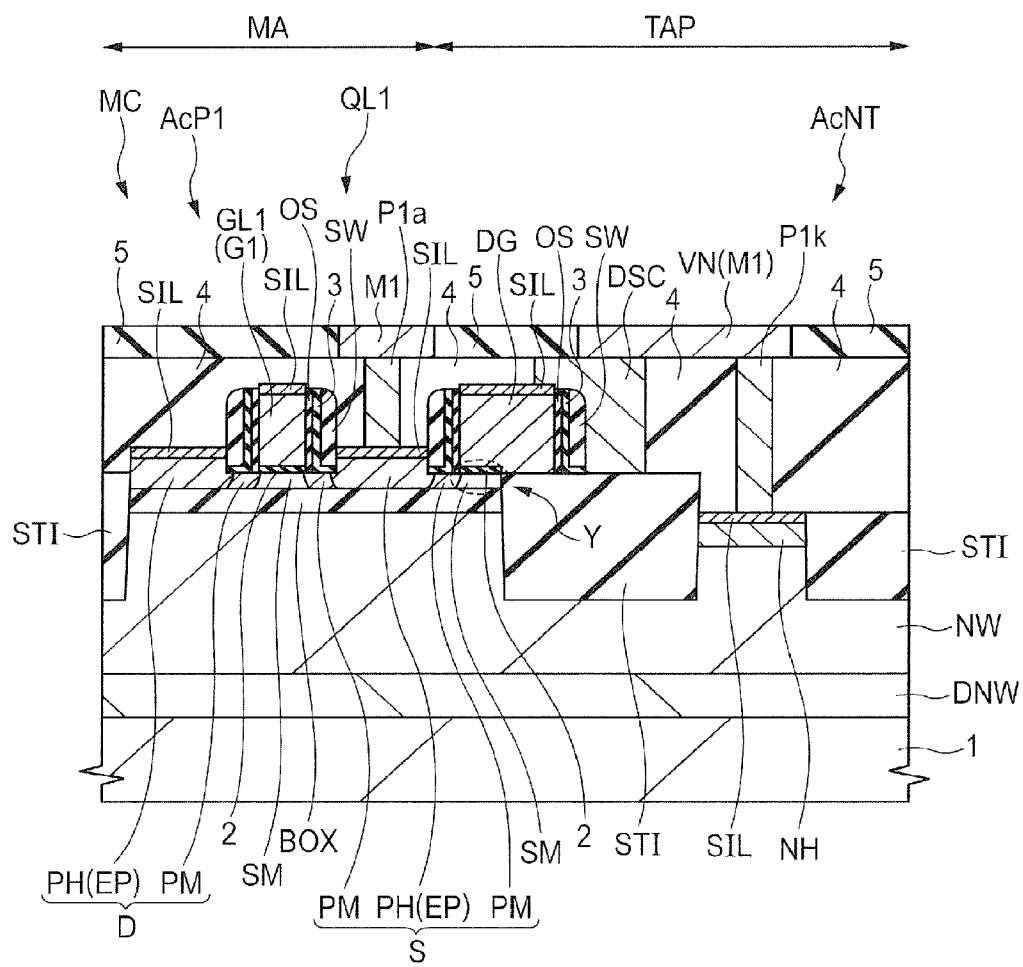
FIG. 12 is a sectional view showing a comparative example conceived by the present inventors.
Figure 13:
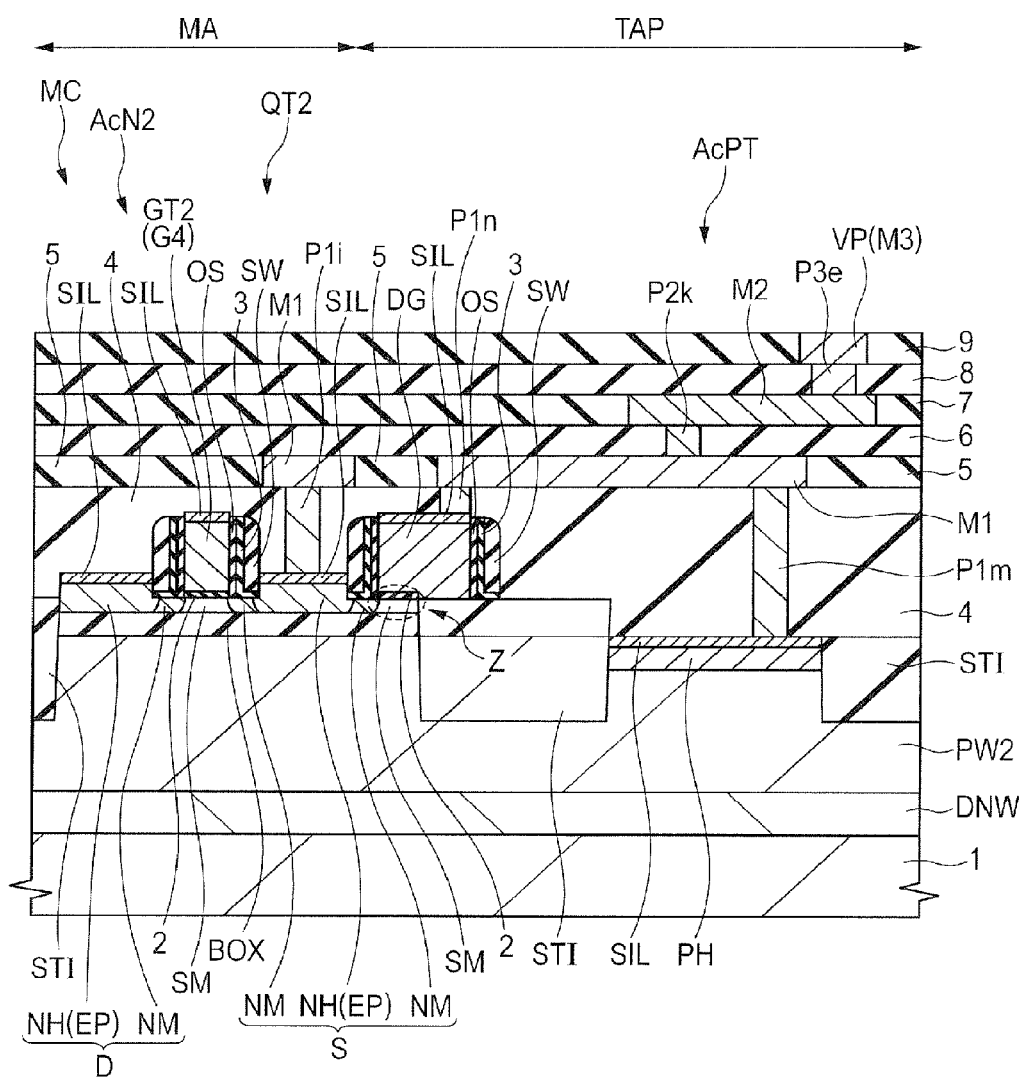
FIG. 13 is a sectional view showing a comparative example conceived by the present inventors.

FIG. 8 is a plan view conceptually showing the position of a tap region in the SRAM region according to this embodiment. FIG. 9 is a plan view showing memory arrays and a tap region in the SRAM region according to this embodiment. FIG. 10 is a sectional view taken along the line C-C of FIG. 9. FIG. 11 is a sectional view taken along the line D-D of FIG. 9. FIGS. 12 and 13 are sectional views showing comparative examples conceived by the present inventors. As shown in FIG. 8, a tap region TAP lies between memory arrays adjacent to each other in the Y direction (direction in which the bit lines extend). The n-type well regions NW and p-type well regions PW1 and PW2, which are located under memory cells MC, extend in the Y direction lie continuously in the memory arrays MA and tap region TAP which are adjacent to each other in the Y direction.

The tap region TAP extends in the X direction (direction in which the word line extends) with a desired width in the Y direction (direction in which the bit lines extend). The tap region TAP is a power supply region for the n-type well region NW and p-type well regions PW1 and PW2 and includes power supply wirings VN and VP which extend in the X direction. In the tap region TAP, the power supply wiring VN extending in the X direction is coupled with the n-type well NW extending in the Y direction through the plug conductor layer P1k. Also, in the tap region TAP, the power supply wiring VP extending in the X direction is coupled with the p-type wells PW1 and PW2 extending in the Y direction through the plug conductor layer P3e. The plug conductor layer P1k is structurally the same as the plug conductor layers P1a, P1b, P1c, P1d, P1e, P1f, P1g, P1h, P1i, and P1j which are shown in FIG. 3 and the plug conductor layer P3e is structurally the same as the plug conductor layers P3a, P3b, P3c, and P3d which are shown in FIG. 5.

In short, the potentials shown in FIG. 2 are supplied from the power supply wirings VN and VP to the n-type well region NW and p-type well regions PW1 and PW2.

FIG. 9 is a plan view showing adjacent memory arrays MA and a tap region TAP between them, in which each memory array MA includes two memory cells MC adjacent to each other in the X direction. The memory cells are as shown in FIG. 3 and the second layer wiring M2 and third layer wiring M3 shown in FIGS. 4 and 5 are omitted in the figure.

As shown in FIG. 9, in the tap region TAP, an active region AcNT is formed in an n-type well region NW and an n-type high-concentration semiconductor region NH is formed in an active region AcNT. A silicide layer SIL is formed over the surface of the n-type high-concentration semiconductor region NH. As shown in FIG. 10, the active region AcNT is formed over the surface of the n-type well region NW and the insulating layer BOX and semiconductor layer SM do not exist in the active region ACNT.

In the tap region TAP, an active region AcPT is formed in the p-type well regions PW1 and PW2 and a p-type high-concentration semiconductor region PH is formed in the active region AcPT. Also, a silicide layer SIL is formed over the surface of the p-type high-concentration semiconductor region PH. As shown in FIG. 11, the active region AcPT is formed over the surfaces of the p-type well regions PW1 and PW2 and the insulating layer BOX and semiconductor layer SM do not exist in the active region AcPT.

As shown in FIG. 9, in the tap region TAP, the power supply wiring VN as the first layer wiring M1 and the power supply wiring VP as the third layer wiring M3 extend in the X direction. The power supply wiring VN is coupled with the n-type high-concentration semiconductor region NH formed in the active region AcNT through the plug conductor layer P1k and silicide layer SIL (see FIG. 10). The power supply wiring VP is coupled with the p-type high-concentration semiconductor region PH formed in the active region AcPT through the plug conductor layer P3e, second layer wring M2, plug conductor layer P2k, first layer wiring M1, plug conductor layer P1m and silicide layer SIL (see FIG. 11).

In the tap region TAP, active regions AcPT and AcNT are alternately arranged in line in the X direction and the power supply wiring VN as the first layer wiring M1 extends in the X direction, meandering in the Y direction in a manner to avoid the active regions AcPT.

As shown in FIG. 9, a plurality of dummy gate electrode layers DG are formed in the tap region TAP. Each dummy gate electrode layer DG has the shape of a rectangle extending in the X direction and has the same length as the gate electrode layers G1, G2, G3, and G4 of the memory cell MC in the X direction. In the Y direction, the width of the dummy gate electrode layer DG is the same as the width of the gate electrode layers G3 and G4 of the memory cell MC.

In an upper area of the tap region TAP, a plurality of dummy gate electrode layers DG are arranged in line along the X direction adjacently to the memory array MA located above the tap region TAP (hereinafter called the upper memory array MA). Similarly, in a lower area of the tap region TAP, a plurality of dummy gate electrode layers DG are arranged in line along the X direction adjacently to the memory array MA located below the tap region TAP (hereinafter called the lower memory array MA). In short, in the tap region TAP, dummy gate electrode layers DG lie side by side in the X direction in two rows, in which the two rows are arranged in the Y direction. For the sake of convenience, the row of dummy gate electrode layers DG adjacent to the upper memory array MA is called the upper dummy gate group and the row of dummy gate electrode layers DG adjacent to the lower memory array MA is called the lower dummy gate group. In the Y direction, active regions AcPT and AcNT lie between the upper dummy gate group and the lower dummy gate group.

First, the relation between the memory cell in the upper memory array MA which is closest to the tap region TAP, and the upper dummy gate group will be explained.

As shown in FIG. 9, dummy gate electrode layers DG lie parallel to the gate electrode layers G1 and G4 in the memory cell MC in a manner to overlap the gate electrode layers G1 and G4 in the Y direction.

Spacing SP1 between a gate electrode layer G1 and a dummy gate electrode layer DG in the Y direction is equal to spacing SP2 between a gate electrode layer G1 and a gate electrode layer G3 in the Y direction. Similarly, the spacing between a gate electrode layer G4 and a dummy gate electrode layer DG in the Y direction is equal to the spacing between a gate electrode layer G4 and a gate electrode layer G2 in the Y direction.

The active regions AcN1, AcP1, and AcN2 in the memory cell MC extend so as to reach and cross the dummy gate electrode layers DG in the tap region TAP.

A dummy shared contact conductor layer DSC is coupled with an end of a dummy gate electrode layer DG. The dummy shared contact conductor layer DSC is structurally the same as the shared contact conductor layer SC in the memory cell MC.

The relation between the memory cell in the lower memory array MA which is closest to the tap region TAP, and the lower dummy gate group is the same as explained above and its description is omitted.

FIG. 10 is a sectional view taken along the line C-C of FIG. 9, showing, from left, QL1 of the memory cell MC, the dummy gate electrode layer DG in the tap region TAP, and the joint between the power supply wiring VN and the n-type well region NW in the tap region TAP. As shown in FIG. 10, active regions AcP1 and AcNT lie in the n-type well region NW. A semiconductor layer SM lies over the surface of the n-type well region NW in the active region AcP1 through an insulating layer BOX and a p-type gate electrode GL1 is formed over the semiconductor layer SM through a gate insulating film 2. A source region S and a drain region D are formed at both ends of the gate electrode GL1 in a manner to sandwich the gate electrode GL1. The source region S is coupled with the first layer wiring M1 through a plug conductor layer P1*a* and as shown in FIG. 6, the source region S is coupled with the supply potential line Vdd.

A p-type dummy gate electrode layer DG is formed over the semiconductor layer SM adjacently to the source region S through the gate insulating film 2. The dummy gate electrode layer DG lies in a manner to straddle the active region AcP1 and the element isolation region STI adjacent to it. A dummy shared contact conductor layer DSC coupled with the dummy gate electrode layer DG is formed over the dummy gate electrode layer DG. However, the upper surface of the dummy shared contact conductor layer DSC is entirely covered by an insulating film 5 and not coupled with a wiring such as the first layer wiring M1. For example, as shown in FIG. 9, the power supply wiring VN does not overlap the dummy shared contact conductor layer DSC. In short, the dummy gate electrode layer DG and dummy shared contact conductor layer DSC are electrically floating. Here, "floating" means, for example, that the dummy gate electrode layer DG is not physically coupled with a wiring through a conductor layer (or directly). In other words, the dummy gate electrode layer DG is not supplied with any electric potential such as a supply potential or grounding potential. In short, the periphery of the dummy gate electrode layer DG or the periphery of the dummy gate electrode layer DG and dummy shared contact conductor layer DSC coupled with it is covered by an insulating film.

In the active region AcNT as the joint between the power supply wiring VN and n-type well region NW, an n-type high-concentration semiconductor region NH is formed over the surface of the n-type well region NW and a silicide layer SIL is formed over the surface of the n-type high-concentration semiconductor region NH. The silicide layer SIL over the surface of the n-type high-concentration semiconductor region NH is coupled with the power supply wiring VN as the first layer wiring M1 through the plug conductor layer P1*k*. In short, the potential supplied to the power supply wiring VN is applied to the n-type well region NW.

FIG. 12 is a sectional view of a comparative example conceived by the present inventors, which corresponds to the sectional view of FIG. 10. FIG. 12 is different from FIG. 10 in that the power supply wiring VN extends in a manner to lie over the dummy shared contact conductor layer DSC and is coupled with the dummy shared contact conductor layer DSC. This means that the dummy gate electrode layer DG is not floating but it is supplied with the potential as shown in FIG. 2 from the power supply wiring VN. During standby time, for example, Vdd+2.0 (V) is applied to the dummy gate electrode layer DG from the power supply wiring VN and the potential of the source region S of QL1 is Vdd, so a potential difference of 2.0 (V) is generated in spot Y of the gate insulating film 2 as shown in FIG. 12. The present inventors have found the problem that this potential difference may cause breakdown of the gate insulating film 2 and generate a leak current between the power supply wiring VN and the source region S of QL1, resulting in an increase in power consumption.

In this embodiment, as shown in FIG. 10, the dummy gate electrode layer DG is floating and the potential of the power supply wiring VN is not applied to it, so breakdown of the gate insulating film 2 does not occur and power consumption can be reduced.

FIG. 11 is a sectional view taken along the line D-D of FIG. 9, showing, from left, QT2 of the memory cell MC, the dummy gate electrode layer DG in the tap region TAP, and the joint between the power supply wiring VP in the tap region TAO and the p-type well region PW2. As shown in FIG. 11, active regions AcN2 and AcPT lie in the p-type well region PW2. A semiconductor layer SM lies over the surface of the p-type well region PW2 in the active region AcN2 through an insulating layer BOX and an n-type gate electrode GT2 is formed over the semiconductor layer SM through a gate insulating film 2. A source region S and a drain region D are formed at both ends of the gate electrode GT2 in a manner to sandwich the gate electrode GT2. The source region S is coupled with the first layer wiring M1 through a plug conductor layer P1*i* and as can be seen from FIGS. 3 and 4, the source region S is coupled with the bit line BLB.

As shown in FIG. 11, an n-type dummy gate electrode layer DG is formed over the semiconductor layer SM adjacently to the source region S through the gate insulating film 2. The dummy gate electrode layer DG lies in a manner to straddle the active region AcN2 and the element isolation region STI adjacent to it. The upper surface of the dummy gate electrode layer DG is entirely covered by an insulating film 5 and not coupled with a wiring such as the first layer wiring M1. For example, as shown in FIG. 9, the first layer wiring M1 extends from the joint between the power supply wiring VP and the p-type well region PW2 so as to lie over the dummy gate electrode layer DG, but it is not coupled with the dummy gate electrode layer DG. In short, the dummy gate electrode layer DG is electrically floating.

As shown in FIG. 11, in the active region AcPT as the joint between the power supply wiring VP and p-type well region PW2, a p-type high-concentration semiconductor region PH is formed over the surface of the p-type well region PW and a silicide layer SIL is formed over the surface of the p-type high-concentration semiconductor region PH. The silicide layer SIL over the surface of the p-type high-concentration semiconductor region PH is coupled with the power supply wiring VP as the third layer wiring M3 through the plug conductor layer P1*m*, first layer wiring M1, plug conductor layer P2*k*, second layer wiring layer M2, and plug conductor layer P3*e*. In short, the potential supplied to the power supply wiring VP is applied to the p-type well region PW2.

The first layer wiring M1 coupled with the p-type well region PW2 extends so as to lie over the dummy gate electrode layer DG and overlap the dummy gate electrode layer DG, but it is not coupled with the dummy gate electrode layer DG.

Insulating films 6, 7, 8, and 9 are a silicon oxide film (SiO); however, instead, they may be a carbon-containing silicon oxide film (SiOC film), silicon oxide film containing nitrogen and carbon (SiCON film), or fluorine-containing silicon oxide film (SiOF film), in the form of a single-layer film or laminated film.

The via conductor layer P2*k* and second layer wiring M2 are integrated. The via conductor layer P2*k* and second layer wiring M2 are a copper via and a copper wiring which are made by the dual damascene method and have a laminated structure including a barrier conductor film and a copper-based main conductor film overlying it. The barrier conductor film is made of tantalum (Ta), titanium (Ti), ruthenium (Ru), tungsten (W), manganese (Mn) or nitride or silicon nitride containing any of these elements or is a laminated film as a combination of these. The copper-based main conductor film is made of copper (Cu) or copper alloy (copper (Cu) combined with aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), indium (In), lanthanoid metal or actinoid metal). The via conductor layer P3e and third layer wiring M3 are integrated like the via conductor layer P2k and second layer wiring M2.

FIG. 13 is a sectional view of a comparative example conceived by the present inventors, which corresponds to the sectional view of FIG. 11. FIG. 13 is different from FIG. 11 in that the first layer wiring M1 coupled with the power supply wiring VP is coupled with the dummy gate conductor layer DG through the plug conductor layer P1n. This means that the dummy gate electrode layer DG is not floating but it is supplied with the potential as shown in FIG. 2 from the power supply wiring VP. During standby time, for example, VSS−2.0 (V) is applied to the dummy gate electrode layer DG from the power supply wiring VP and the potential of the source region S of QT2 coupled with the bit line BLB is Vdd or VSS, so a maximum potential difference of Vdd+2.0 (V) is generated in spot Z of the gate insulating film 2 as shown in FIG. 13. The present inventors have found the problem that this potential difference may generate a leak current between the power supply wiring VP and the source region S, resulting in an increase in power consumption.

As shown in FIG. 11, according to this embodiment, the dummy gate electrode layer DG is floating and the potential of the power supply wiring VP is not applied to it, so breakdown of the gate insulating film 2 does not occur and power consumption can be reduced.

Since the dummy gate electrode layers DG are formed in the tap region TAP as shown in FIG. 9, processing accuracy can be increased in the photolithographic process to form gate electrode layers G1 and G4 in a memory cell MC adjacent to the tap region TAP. Specifically, thinning of the gate electrode layers G1 and G4 or a similar problem can be prevented. Therefore, stable electric characteristics (threshold, current between source and drain, etc.) can be achieved in the memory cell MC adjacent to the tap region TAP.

The invention made by the present inventors has been so far explained concretely in reference to the preferred embodiment thereof. However, the invention is not limited thereto and it is obvious that these details may be modified in various ways without departing from the gist thereof.

What is claimed is:

1. A semiconductor device, comprising:
a semiconductor substrate having a first well region;
an insulating layer formed on a first portion of the semiconductor substrate, and contacted with the first well region;
a semiconductor layer formed on the insulating layer;
an element isolation region reaching to an inside of the first well region, in a cross-sectional view;
a first gate electrode layer formed on a first portion of the semiconductor layer via a first gate insulating film;
a second gate electrode layer formed on both a second portion of the semiconductor layer via a second gate insulating film and a first portion of the element isolation region;
an interlayer insulating film covering the first gate electrode layer, the second gate electrode layer and a second portion of the element isolation region;
a first plug conductor layer formed in the interlayer insulating film, and connected to a third portion of the semiconductor layer;
a second plug conductor layer formed in the interlayer insulating film, and connected to a second portion of the semiconductor substrate;
a first layer wiring formed on the interlayer insulating film, and connected to the first plug conductor layer; and a second layer wiring formed on the interlayer insulating film, and connected to the second plug conductor layer,
wherein the second gate electrode layer comprises a dummy gate electrode layer isolated from the second layer wiring, and
wherein, during a standby time, a first electric potential is to be supplied to the semiconductor layer via the first plug conductor layer, while a second electric potential, which is different from the first electric potential, is to be supplied to the first well region via the second plug conductor layer.

2. The semiconductor device according to claim 1,
wherein the first plug conductor layer is connected to the third portion of the semiconductor layer via a first silicide layer; and
wherein the second plug conductor layer is connected to the second portion of the semiconductor substrate via a second silicide layer.

3. The semiconductor device according to claim 1,
wherein a shared contact conductor layer is formed in the interlayer insulating film, and is formed on the second gate electrode layer and the second portion of the element isolation region, and is connected to the second gate electrode layer via a third silicide layer, and
wherein the shared contact conductor layer is isolated from the second layer wiring.

4. The semiconductor device according to claim 3,
wherein the first well region has a first conductivity type, and
wherein the third portion of the semiconductor layer has a second conductivity type different from the first conductivity type.

5. The semiconductor device according to claim 4,
wherein the first conductivity type is n-type, and
wherein the second conductivity type is p-type.

6. The semiconductor device according to claim 5,
wherein a second well region of n-type is formed between the second plug conductor layer and the first well region.

7. The semiconductor device according to claim 4,
wherein the third portion of the semiconductor layer comprises an epitaxial layer.

8. The semiconductor device according to claim 1, wherein the dummy gate electrode layer lies parallel to the first gate electrode layer such that the dummy gate electrode layer overlaps the first gate electrode layer in a first direction.

9. The semiconductor device according to claim 1, wherein a spacing between the first gate electrode layer and the dummy gate electrode layer in a first direction is equal to a spacing between the first gate electrode layer and a third gate electrode in the first direction.

10. The semiconductor device according to claim 3, wherein the second layer wiring is other than overlapping the shared contact conductor layer.

11. The semiconductor device according to claim 3, wherein the dummy gate electrode layer and the shared contact conductor layer are electrically floating.

12. The semiconductor device according to claim 1, wherein the dummy gate electrode layer is floating and a potential of the second layer wiring is not applied to the dummy gate electrode layer.

13. The semiconductor device according to claim 1, wherein an upper surface of the dummy gate electrode layer is entirely covered by an insulating film and is not coupled with the first layer wiring.

14. The semiconductor device according to claim 1, wherein the first layer wiring extends so as to lie over the dummy gate electrode layer and the first layer wiring is uncoupled with the dummy gate electrode layer.

15. The semiconductor device according to claim 1, wherein the dummy gate electrode layer is electrically floating.

16. A semiconductor device, comprising:
a semiconductor substrate having a first well region;
an insulating layer formed over a first portion of the semiconductor substrate, and contacted with the first well region;
a semiconductor layer formed over the insulating layer;
an element isolation region reaching to an inside of the first well region, in a cross-sectional view;
a first gate electrode layer formed over a first portion of the semiconductor layer via a first gate insulating film;
a second gate electrode layer formed over both a second portion of the semiconductor layer via a second gate insulating film and a first portion of the element isolation region;
an interlayer insulating film covering the first gate electrode layer, the second gate electrode layer and a second portion of the element isolation region;
a first plug conductor layer formed in the interlayer insulating film, and connected to a third portion of the semiconductor layer;
a second plug conductor layer formed in the interlayer insulating film, and connected to a second portion of the semiconductor substrate;
a first layer wiring formed over the interlayer insulating film, and connected to the first plug conductor layer; and
a second layer wiring formed over the interlayer insulating film, and connected to the second plug conductor layer,
wherein the second gate electrode layer comprises a dummy gate electrode layer isolated from the second layer wiring so as to be electrically floating.

17. The semiconductor device according to claim 16, wherein, during a standby time, a first electric potential is to be supplied to the semiconductor layer via the first plug conductor layer, while a second electric potential, which is different from the first electric potential, is to be supplied to the first well region via the second plug conductor layer.

18. The semiconductor device according to claim 16, wherein the first plug conductor layer is connected to the third portion of the semiconductor layer via a silicide layer.

19. The semiconductor device according to claim 16, wherein the second plug conductor layer is connected to the second portion of the semiconductor substrate via a silicide layer.

20. The semiconductor device according to claim 16, wherein a shared contact conductor layer is formed in the interlayer insulating film, and is formed over the second gate electrode layer and the second portion of the element isolation region, and is connected to the second gate electrode layer via a silicide layer, and
wherein the shared contact conductor layer is isolated from the second layer wiring.

* * * * *